United States Patent
Park (10) Patent No.: US 10,199,530 B2
(45) Date of Patent: Feb. 5, 2019

(54) ULTRAVIOLET LIGHT-EMITTING DEVICE AND LIGHT UNIT COMPRISING SAME

(71) Applicant: LG INNOTEK CO., LTD., Seoul (KR)

(72) Inventor: Hae Jin Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 15/552,745

(22) PCT Filed: Feb. 23, 2016

(86) PCT No.: PCT/KR2016/001750
§ 371 (c)(1),
(2) Date: Aug. 22, 2017

(87) PCT Pub. No.: WO2016/137197
PCT Pub. Date: Sep. 1, 2016

(65) Prior Publication Data
US 2018/0047866 A1    Feb. 15, 2018

(30) Foreign Application Priority Data
Feb. 23, 2015   (KR) .................. 10-2015-0025277

(51) Int. Cl.
*H01L 33/36* (2010.01)
*H01L 33/00* (2010.01)
(Continued)

(52) U.S. Cl.
CPC .......... *H01L 33/0025* (2013.01); *H01L 33/06* (2013.01); *H01L 33/12* (2013.01);
(Continued)

(58) Field of Classification Search
None
See application file for complete search history.

(56) References Cited

U.S. PATENT DOCUMENTS 8,859,313 B2 * 10/2014 Sakai .................. B82Y 20/00
257/13
9,373,764 B2 * 6/2016 Hodota ................ H01L 33/38
(Continued)

FOREIGN PATENT DOCUMENTS

JP   2011-187572 A   9/2011
JP   2013-165261 A   8/2013
(Continued)

OTHER PUBLICATIONS

Machine translttion of KR10-2013-0011285 is attached.*
International Search Report, issued in PCT/KR2016/001750, dated Jun. 15, 2016.

Primary Examiner — Bilkis Jahan
(74) Attorney, Agent, or Firm — Birch, Stewart, Kolasch & Birch, LLP (57) ABSTRACT

The present embodiments disclose a light emitting device. The light emitting device disclosed includes a first conductive semiconductor layer; an active layer that is disposed on a first conductive semiconductor layer and generates ultraviolet wavelength; an electron blocking layer that is disposed on the active layer; a second conductive semiconductor layer that is disposed on the electron blocking layer; a third conductive semiconductor layer that is disposed on the second conductive semiconductor layer; and an electrode that is disposed on the third conductive semiconductor layer, in which the second and third conductive semiconductor layers include an AlGaN semiconductor, and in which the third conductive semiconductor layer has a lower aluminum composition than that of the second conductive semiconductor layer and has an electrical contact resistance with the electrode that is lower than that of the second conductive semiconductor layer.

19 Claims, 5 Drawing Sheets

(51) Int. Cl.
*H01L 33/06* (2010.01)
*H01L 33/12* (2010.01)
*H01L 33/32* (2010.01)
*H01L 33/60* (2010.01)
*H01L 33/14* (2010.01)
*H01L 33/46* (2010.01)
*H01L 33/48* (2010.01)

(52) U.S. Cl.
CPC .............. *H01L 33/14* (2013.01); *H01L 33/32* (2013.01); *H01L 33/36* (2013.01); *H01L 33/60* (2013.01); *H01L 33/145* (2013.01); *H01L 33/46* (2013.01); *H01L 33/486* (2013.01)

(56) References Cited

U.S. PATENT DOCUMENTS

| | | | |
|---|---|---|---|
| 2012/0326169 | A1 | 12/2012 | Sakai |
| 2013/0181188 | A1 | 7/2013 | Ooshika |
| 2014/0175489 | A1 | 6/2014 | Hodota |
| 2015/0286107 | A1* | 10/2015 | Chen ..................... G02F 1/1533 359/267 |

FOREIGN PATENT DOCUMENTS

| | | |
|---|---|---|
| JP | 2014-127565 A | 7/2014 |
| KR | 10-2009-0108675 A | 10/2009 |
| KR | 10-2012-0111364 A | 10/2012 |
| KR | 10-2014-0036716 A | 3/2014 |
| KR | 10-2014-0098518 A | 8/2014 |
| KR | 10-2015-0123138 A | 11/2015 |

* cited by examiner

| INCIDENT WAVELENGTH [nm] | Sample # | %T |
|---|---|---|
| 275 | 1 | 54.3 |
| 275 | 2 | 53.3 |
| 275 | 3 | 48.8 |
| 275 | 4 | 60.1 |

ULTRAVIOLET LIGHT-EMITTING DEVICE AND LIGHT UNIT COMPRISING SAME

CROSS REFERENCE TO RELATED APPLICATIONS

This application is the National Phase of PCT International Application No. PCT/KR2016/001750, filed on Feb. 23, 2016, which claims priority under 35 U.S.C. 119(a) to Patent Application No. 10-2015-0025277, filed in the Republic of Korea on Feb. 23, 2015, all of which are hereby expressly incorporated by reference into the present application.

TECHNICAL FIELD

The present embodiments relate to a light emitting device.

The present embodiments relate to an ultraviolet light emitting device.

The present embodiments relate to a light unit having an ultraviolet light emitting device.

BACKGROUND ART

In general, a nitride semiconductor material including a group V source such as nitrogen (N) and a group III source such as gallium (Ga), aluminum (Al), or indium (In) has excellent thermal stability and a direct transition type energy band structure and thus is widely used as a material for a nitride-based semiconductor device such as a nitride-based semiconductor light emitting device in an ultraviolet light region and a solar cell.

The nitride-based material has a wide energy band gap of 0.7 eV to 6.2 eV, and thus is widely used as a material for a solar cell device due to the characteristics matching with the solar spectrum region. In particular, ultraviolet light emitting devices are used in various industrial fields such as a curing apparatus, a medical analyzer, a therapeutic apparatus, and a sterilizing, water purification, and purification system and is attracting attention as a usable material for general illumination as a semiconductor lighting source in the future.

DISCLOSURE

Technical Problem

The present embodiments provide a light emitting device that is in ohmic contact with an electrode using a second conductive type semiconductor layer and a light unit having the same.

The present embodiments provide a light emitting device that emits light having an ultraviolet wavelength, for example, an ultraviolet-C (UV-C) wavelength, and a light unit having the same.

Technical Solution

According to the present embodiment, there is provided a light emitting device including: a first conductive semiconductor layer; an active layer that is disposed on a first conductive semiconductor layer and generates ultraviolet wavelength; an electron blocking layer that is disposed on the active layer; a second conductive semiconductor layer that is disposed on the electron blocking layer; a third conductive semiconductor layer that is disposed on the second conductive semiconductor layer; and an electrode that is disposed on the third conductive semiconductor layer, in which the second and third conductive semiconductor layers include an AlGaN semiconductor, and in which the third conductive semiconductor layer has lower aluminum composition than that of the second conductive semiconductor layer and has an electrical contact resistance with the electrode that is lower than that of the second conductive semiconductor layer.

According to the present embodiment, there is provided a light emitting device including: an AlN substrate; a first conductive semiconductor layer that is disposed on the AlN substrate and that has composition of aluminum; an active layer that is disposed on the first conductive semiconductor layer and that generates ultraviolet wavelength; a second conductive semiconductor layer that is disposed on the active layer; a third conductive semiconductor layer which is disposed on the second conductive semiconductor layer; and an electrode that is in contact with an upper surface of the third conductive semiconductor layer and that is formed of metal, in which the second and the third conductive semiconductor layers include an AlGaN-based semiconductor, in which the third conductive semiconductor layer has composition of aluminum which is lower than that of the second conductive semiconductor layer, in which the third conductive semiconductor layer has an electrical contact resistance that is lower than that of the second conductive semiconductor layer, and in which the third conductive semiconductor layer is in ohmic contact with the electrode.

According to the present embodiment, there is provided a light unit including: a body that has a cavity; the light emitting element that is disposed in the cavity; a transparent window that is disposed within the cavity; and a moisture-proof film that is disposed on the transparent window and the body.

Advantageous Effects

According to the light emitting device of the present embodiments, the electrical contact between the second conductivity type semiconductor layer and the electrode can be improved.

According to the light emitting device of the present embodiments, transmittance through the second conductivity type semiconductor layer can be improved.

According to the present embodiments, defects transferred to the active layer can be removed.

According to the light emitting device of the embodiments, internal quantum efficiency can be improved.

The embodiments can improve reliability of the ultraviolet light emitting device for sterilization.

The embodiments can provide a light emitting device package having an ultraviolet light emitting device and a light unit such as an ultraviolet lamp.

BEST MODE

In the description of embodiments, in a case where it is described that respective layers (films), regions, patterns or structures are formed "on/over" or "under" substrates, respective layers (films), regions, pads or patterns, a state where the layer or the like is formed "on/over" and the "under" the substrates or the like includes all a state where the layer or the like is formed "directly" or "by interposing the other layer therebetween (indirectly)" on/over and under the substrate or the like. In addition, the criteria for on/over or under of respective layers will be described with reference to the drawings.

<Light Emitting Device>

Figure 1:
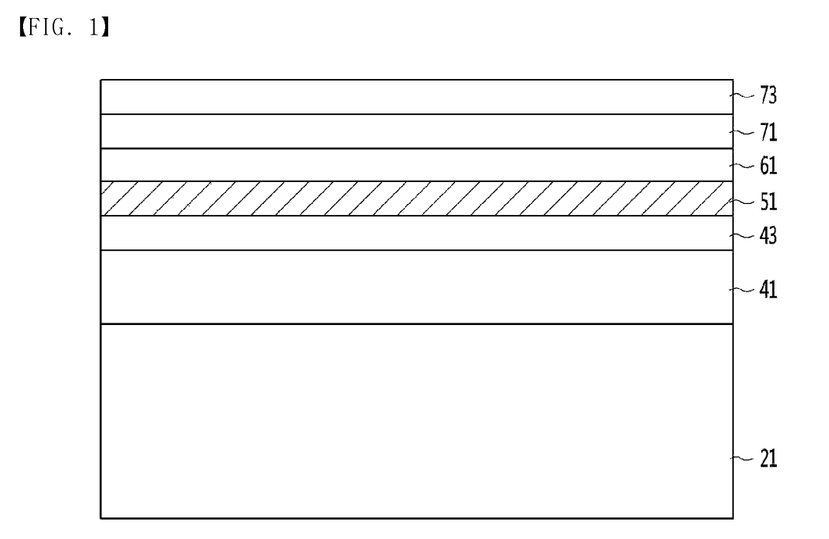
FIG. 1 is a view illustrating a light emitting device according to an embodiment.

FIG. 1 is a cross-sectional view illustrating a light emitting device according to a first embodiment.

With reference to FIG. 1, a light emitting device according to an embodiment includes a substrate 21, a first conductive semiconductor layer 41 that is disposed on the substrate 21; a first clad layer 43 that is disposed on the first conductive semiconductor 41; an active layer 51 that is disposed on the first clad layer 43; an electron blocking layer 61 that is disposed on the active layer 51; a second conductive semiconductor layer 71 that is disposed on the electron blocking layer 61; and a third conductive semiconductor layer 73 that is disposed on the second conductive semiconductor layer 71.

The light emitting device emits light having ultraviolet wavelength. The light emitting device can emit light having a wavelength of 300 nm or less, for example, a wavelength in a range of 200 nm to 290 nm. The light emitting device may be a device that emits light having a UV-C wavelength.

The substrate 21 may be a translucent substrate, a conductive substrate or an insulating substrate, for example. For example, the substrate 21 may include at least one of AlN, sapphire ($Al_2O_3$), SiC, Si, GaAs, GaN, ZnO, GaP, InP, Ge, and $Ga_2O_3$. A plurality of protrusion portion (not illustrated) may be formed on an upper surface and/or a lower surface of the substrate 21, a side end surface of each of the plurality of protrusion portions may include at least one of a hemispherical shape, a polygonal shape, and an oval shape, and the protrusion portions may be disposed in a strip form or a matrix form. The protrusion portions can improve the light extraction efficiency.

A plurality of compound semiconductor layers may be grown on the substrate 21 and growth equipment of the plurality of compound semiconductor layers may be formed by an electron beam evaporator, physical vapor deposition (PVD), chemical vapor deposition (CVD), plasma laser deposition (PLD), a dual-type thermal evaporator, sputtering, metal organic chemical vapor deposition (MOCVD), or the like. However, the present embodiment is not limited thereto.

A first conductive semiconductor layer 41 may be disposed between the substrate 21 and the first clad layer 43. The first conductive semiconductor layer 41 may be implemented by a group II-VI or a III-V group compound semiconductor. The first conductive semiconductor layer 41 may be at least one of an AlN semiconductor layer, an AlGaN/AlN superlattice structure, and an AlGaN semiconductor layer. A buffer layer may be further disposed between the substrate 21 and the first conductive semiconductor layer 41, but the present embodiment is not limited thereto.

Figure 10:
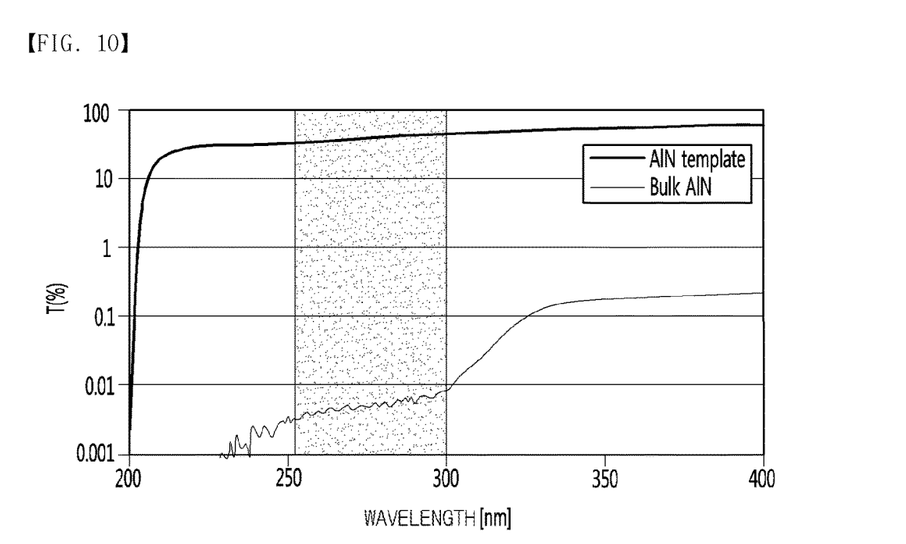
FIG. 10 is a diagram comparing the transmittances of an AlN template and a bulk AlN substrate at ultraviolet wavelength according to an embodiment.

In a case where the substrate 21 is a sapphire substrate and the first conductive semiconductor layer 41 is an AlN template, as illustrated in FIG. 10, it can be seen that the transmittance T is 50% or more with respect to the ultraviolet wavelength. In a case where the substrate 21 is a bulk AlN substrate and the first conductive semiconductor layer 41 is AlN, as illustrated in FIG. 10, it can be seen that the transmittance T is 0.01% or less with respect to the ultraviolet wavelength. The transmittance of the ultraviolet wavelength is a case where the thickness of the substrate 21 is 30 μm, and the transmittance can be further improved in a case where the thickness of the substrate 21 is 20 μm or less.

Crystal defects of the first conductive semiconductor layer 41 grown on the bulk AlN substrate may be smaller than crystal defects of the first conductive semiconductor layer 41 grown on the sapphire substrate. For example, the dislocation density of the AlN layer grown on the bulk AlN substrate may be less than the dislocation density of the AlN layer grown on the sapphire substrate. Although the dislocation density of the AlN layer grown on the sapphire substrate is 1E9 cm-2 or more, the dislocation density of the AlN layer grown on the bulk AlN substrate is 1E7 cm-2 or less. Therefore, in a case where the AlN layer is grown on the bulk AlN substrate, dislocation defects due to the difference in lattice constant can be decreased. In addition, in a case where the bulk AlN substrate is removed or in a case where the bulk AlN substrate is provided with a thickness of 20 μm or less, a decrease in transmittance due to the bulk AlN substrate can be prevented.

As another example, in a case where the first conductive semiconductor layer 41 is an AlGaN/AlN superlattice structure, composition of aluminum of AlGaN in the AlGaN/AlN superlattice structure may be gradually decreased as the AlGaN layer is positioned to be adjacent to the active layer 51. In the AlGaN/AlN superlattice structure, the difference in composition of aluminum may be gradually increased and may be 30% or more or 50% or more, for example, as the AlGaN/AlN pair is positioned to be adjacent to the active layer 51. The thickness of the AlGaN/AlN superlattice structure may be gradually increased as the AlGaN layer is positioned to be adjacent to the active layer 51. In the AlGaN/AlN superlattice structure, the difference in the thickness of the AlGaN/AlN layer may be gradually increased, as the AlGaN/AlN pair is positioned to be adjacent to the active layer 51.

The first conductive semiconductor layer 41 according to the embodiment may include a superlattice structure. In a case where the superlattice structure is an AlGaN/AlN or AlN/AlGaN pair, the transmittance to ultraviolet wavelength can be improved. In addition, an a-axis lattice constant values are listed in the order of AlN>AlGaN>GaN, when AlN is grown on AlGaN having a small a-axis lattice constant value, compressive stress is applied and when AlGaN is grown on AlN again, tensile stress is applied. By such a growth of AlGaN/AlN being periodically repeated, the compressive stress and the tensile stress, which are opposite stresses to each other, are canceled. In addition, since AlGaN and AlN have a wurtzite crystal structure which is crystallographically identical to each other, a stable superlattice structure can be provided. Stress, polarization phenomenon, and defects transmitted to the active layer 51 can be decreased by the superlattice structure of the first conductive semiconductor layer 41.

The first conductive semiconductor layer 41 may include at least one of other semiconductors including aluminum, such as InAlGaN, AlInN, AlGaAs, and AlGaInP material. The first conductive semiconductor layer 41 may be an n-type semiconductor layer doped with a first conductive dopant, for example, an n-type dopant such as Si, Ge, Sn, Se, and Te.

The first clad layer 43 may be disposed on the first conductive semiconductor layer 41. The first clad layer 43 may be in contact with an upper surface of the first conductive semiconductor layer 41. The first clad layer 43 may be in contact with AlGaN or AlN of the first conductive semiconductor layer 41. The first cladding layer 43 may include an AlGaN semiconductor and may be an n-type semiconductor layer doped with a first conductive dopant, for example, an n-type dopant such as Si, Ge, Sn, Se, and Te. The first clad layer 43 may have a composition of aluminum of 50% or more.

The active layer 51 may be disposed on the first cladding layer 43. The active layer 51 may be in contact with the upper surface of the first clad layer 43. The active layer 51 may be formed of at least one of a single well, a single quantum well, a multi well, a multi quantum well (MQW) structure, a quantum-wire structure, or a quantum dot structure.

The active layer 51 is a layer in which electrons (or holes) injected through the first conductive semiconductor layer 41 and holes (or electrons) injected through the second conductive semiconductor layer 71 meet with each other and thus that emits light due to difference in a band gap of an energy band according to a forming material of the active layer 51.

The active layer 51 may be implemented by a compound semiconductor. The active layer 51 may be implemented by at least one of group II-VI and group III-V compound semiconductors, for example.

In a case where the active layer 51 is implemented by a multi-well structure, the active layer 51 includes a plurality of well layers (not illustrated) and a plurality of barrier layers (not illustrated). In the active layer 51, the well layer and the barrier layer are arranged alternately. The pair of the well layer and the barrier layer may be formed in 2 to 30 periods.

The well layer may be disposed as a semiconductor material having a composition formula of $In_xAl_yGa_{1-x-y}N$ ($0 \leq X \leq 1$, $0 \leq Y \leq 1$, $0 \leq X+y \leq 1$), for example. The barrier layer may be disposed as a semiconductor material having a composition formula of $In_xAl_yGa_{1-x-y}N$ ($0 \leq X \leq 1$, $0 \leq Y \leq 1$, $0 \leq X+y \leq 1$), for example.

The period of the well layer/barrier layer includes at least one of pairs of InGaN/GaN, GaN/ALGaN, ALGaN/ALGaN, InGaN/AlGaN, InGaN/InGaN, AlGaAs/GaAs, InGaAs/GaAs, InGaP/GaP, AlInGaP/InGaP, and InP/GaAs, for example.

The well layer of the active layer 51 according to the embodiment may be implemented by ALGaN-based conductor, for example, AlGaN and the barrier layer may be implemented by AlGaN-based conductor, for example, AlGaN. The active layer 51 may emit light having ultraviolet wavelength and emit light having ultraviolet wavelength in the range of 200 nm to 290 nm, for example.

Composition of aluminum of the barrier layer has a higher composition than that of the well layer. Composition of aluminum of the well layer may be 40% or less, for example in a range of 20% to 40% and composition of aluminum of the barrier layer may be 40% or more, for example in a range of 40% to 95%. The barrier layer may include a dopant and may include an n-type dopant, for example.

The electron blocking layer 61 may be disposed on the active layer 51. The electron blocking layer 61 may be in contact with an upper surface of the active layer 51 and may be formed as a single layer or a multilayer. The electron blocking layer 61 may be disposed as AlGaN semiconductor and may have a higher aluminum composition than the barrier layer of the active layer 51. The composition of aluminum of the electron blocking layer 61 may be 50% or more.

The electron blocking layer 61 may include a multilayer structure and for example, in a case of the multilayer structure, may include a plurality of semiconductor layers having compositions of aluminum which are different from each other, for example, and at least one layer of the plurality of semiconductor layers may have a composition of aluminum of 50% or more.

The second conductive semiconductor layer 71 is disposed on the electron blocking layer 61. The third conductive semiconductor layer 73 may be disposed on the second conductive semiconductor layer 71.

The second and third conductive semiconductor layers 71 and 73 may be an AlGaN-based semiconductor, for example, AlGaN. The second conductive semiconductor layer 71 may have a composition of aluminum of 50% or more, and a p-type dopant may be added. The p-type dopant concentration may range from 1E16 cm-3 to 1E21 cm-3. If the p-type dopant concentration is less than the range described above, hole injection efficiency is decreased. If the p-type dopant concentration is more than the range described above, crystal quality can be decreased and the electrical characteristics of the third conductive semiconductor layer 73 can be affected.

In a case where the third conductive semiconductor layer 73 is GaN, the ultraviolet wavelength can be absorbed and the light extraction efficiency can be decreased. In a case where an oxide layer such as ITO is disposed on the third conductive semiconductor layer 73, light extraction efficiency may be decreased due to the absorption of ultraviolet wavelength. The third conductive semiconductor layer 73 according to the embodiment may provide a layer that can be in ohmic contact with the second electrode 95 of FIG. 2 by the aluminum composition. To this end, the third conductive semiconductor layer 73 may be an electrode contacting layer that is in contact with the second electrode 95 or an ohmic contacting layer and may be in ohmic contact with the second electrode 95.

Composition of the aluminum of the third conductive semiconductor layer 73 may be 40% or less, for example, in a range of 20% to 40%. In a case where composition of aluminum of the third conductive semiconductor layer 73 is deviated from the range described above, contact resistance between the second electrode 95 and the third conductive semiconductor layer 73 is increased.

Figure 7:
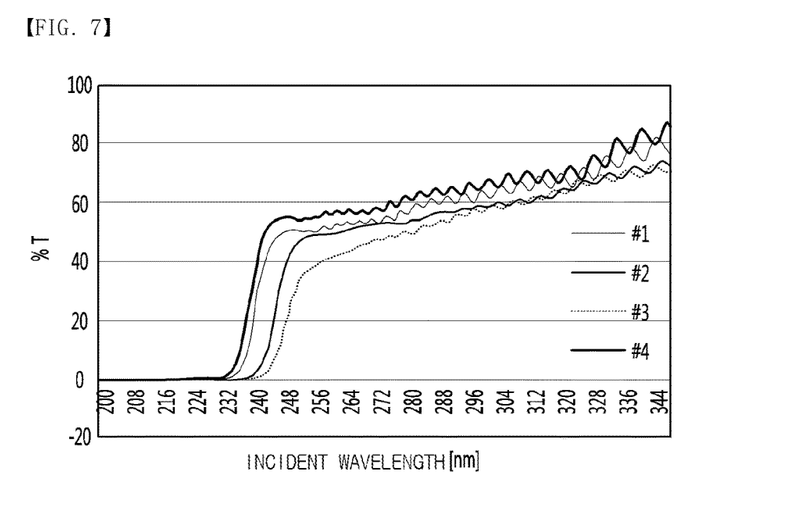
FIG. 7 is a graph comparing transmittances according to composition of aluminum of a third conductive semiconductor layer of the light emitting device according to the embodiment.
Figure 8:
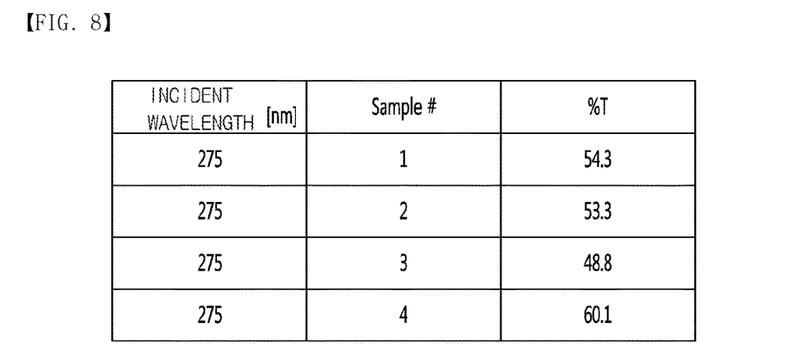
FIG. 8 is a table illustrating the transmittance for each sample of the light emitting device having aluminum composition of FIG. 7.

Sample #1 to #3 of the light emitting device illustrated in FIG. 7 and FIG. 8 is a case where composition of aluminum of the third conductive semiconductor layer 73 is 20%, sample #4 thereof is a case where composition of aluminum of the third conductive semiconductor layer 73 is 40%, and FIG. 7 and FIG. 8 are a transmittance graph according to incident wavelength and a table that obtains the transmittance at 275 nm. As obtained from FIG. 7 and FIG. 8, the transmittance of the third conductive semiconductor layer 73 is 50% or more in a case where composition of aluminum of the third conductive semiconductor layer 73 is 20% to 40%. By providing the light emitting element having such a transmittance, the transmittance of ultraviolet wavelength can be improved.

Figure 9:
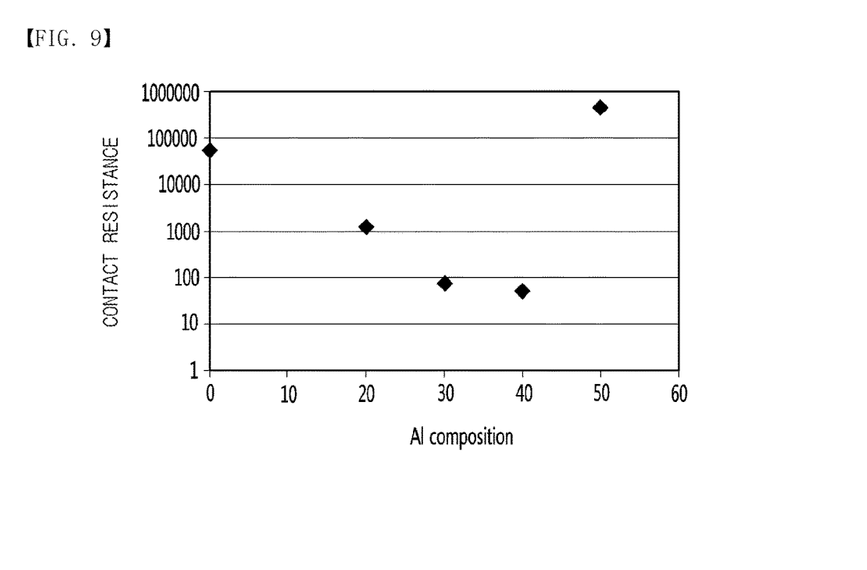
FIG. 9 is a view illustrating the contact resistance of the third conductive semiconductor layer of the light emitting device according to the embodiment.

As illustrated in FIG. 9, the second conductive semiconductor layer 71 has a low contact resistance in a case where aluminum composition thereof is in the range of 20% to 40%, and may have a contact resistance of, for example, $10^2$ $\Omega cm^2$ or less. In a case where composition of aluminum is deviated from the range described above, there is a problem that the contact resistance of the second conductive semiconductor layer 71 is increased by 10 times or more. The contact resistance of the third conductive semiconductor layer 73 may be lower than the contact resistance of the second conductive semiconductor layer 71.

The third conductive semiconductor layer 73 may be added by a second conductivity type dopant such as a p-type dopant, and the p-type dopant concentration may be in a range of 1Ecm-18 or more, for example, 1Ecm-18 to 1Ecm-21. If the concentration of the p-type dopant is lower than the range described above, the contact resistance increases sharply. If the concentration of the p-type dopant is higher than the range described above, there is a problem that film quality is decreased and thus ohmic characteristics are changed. The p-type dopant concentration of the third conductive semiconductor layer 73 may be higher than the p-type dopant concentration of the second conductive semiconductor layer 71.

The third conductive semiconductor layer 73 may have a thickness of 50 nm or less, for example, 40 nm or less. In a case where the third conductive semiconductor layer 73 is more than 50 nm, the transmittance may be lowered to less than 10%, and light extraction may be decreased. The transmittance of ultraviolet wavelength depending on the material and the thickness of the third conductive semiconductor layer 73 can be improved. The light emitting device according to the embodiment can provide the third conductive semiconductor layer 73 having low contact resistance without using the transparent conductive oxide layer.

Figure 2:
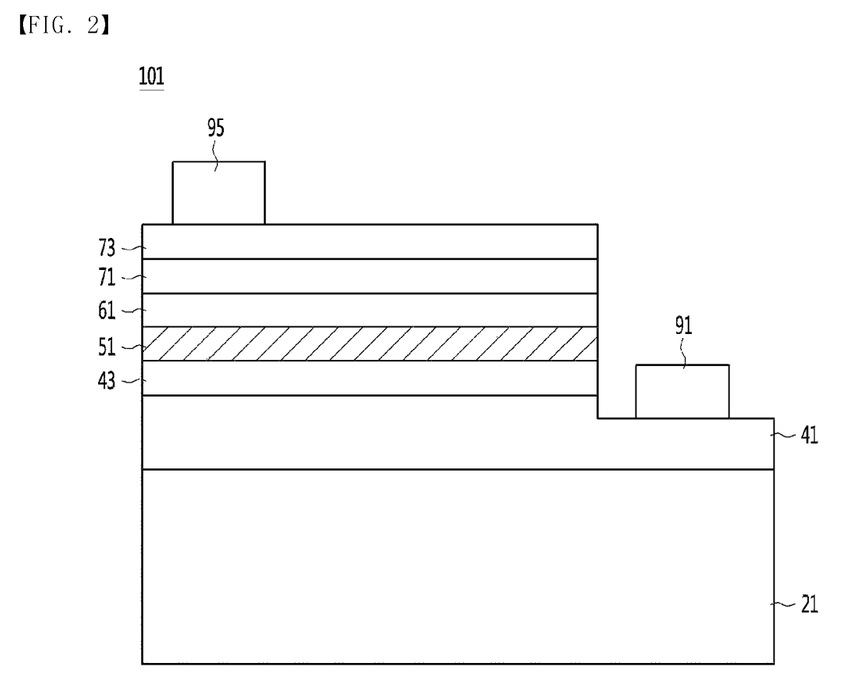
FIG. 2 is an example in which electrodes are disposed in the light emitting device of FIG. 1.

FIG. 2 is an example in which electrodes are disposed in the light emitting element of FIG. 1.

With reference to FIG. 2, in the light emitting device 101, a first electrode 91 may be disposed on the first conductive semiconductor layer 41 and a second electrode 95 may be disposed on the third conductive semiconductor layer 73. The second electrode 95 may be in contact with a portion region or the entire region of the upper surface of the third conductive semiconductor layer 73.

The first and second electrodes 91 and 95 may be selected among a metal such as Ti, Ru, Rh, Ir, Mg, Zn, Al, In, Ta, Pd, Co, Ni, Si, Ge, Ag, and Au and the optional alloys thereof.

The first electrode 91 and the second electrode 95 may further have a current diffusion pattern of an arm structure or a finger structure. The first electrode 91 and the second electrode 95 may be made of a metal having the characteristics of an ohmic contact, an adhesive layer, and a bonding layer, and may be made non-translucent, but the present embodiment is not limited thereto.

By the contact resistance of the third conductive semiconductor layer 73 with the second electrode 95 being lowered in the light emitting element 101 having the ultraviolet wavelength, the decrease in light transmittance can be prevented and the electrical characteristics thereof can be improved.

In the embodiment, although it is described that the first conductivity type is n-type and the second conductivity type is p-type, as another example, the first conductivity type may be p-type and the second conductivity type may be n-type. Alternatively, the light emitting device may include any one structure of an n-p junction structure, a p-n junction structure, an n-p-n junction structure, and a p-n-p junction structure.

Figure 3:
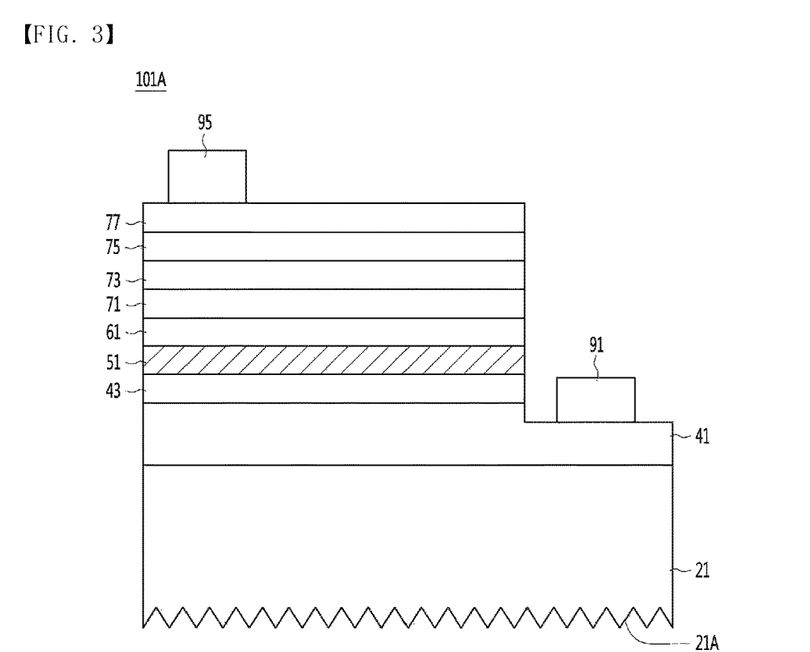
FIG. 3 is another example of the light emitting device of FIG. 2.

FIG. 3 is another example of the light emitting device of FIG. 2.

With reference to FIG. 3, the light emitting device 101A may include an uneven pattern 21A on a bottom surface of the substrate 21. In a case where the substrate 21 is a bulk AlN substrate or a sapphire substrate, the uneven pattern 21A can improve light transmittance. In addition, the substrate 21 may have a thickness that is less than the thickness at the time of growth, for example, 20 µm or less.

The light emitting device according to the embodiment may include a contact layer 75 and a reflective layer 77 between the second electrode 95 and the third conductive semiconductor layer 73. The contact layer 75 may be formed of a translucent material that transmits light of 70% or more, and the reflective layer 77 may be formed of a material having reflective properties that reflects light of 70% or more. The contact layer 75 may be formed of, for example, a metal or a metal oxide. The contact layer 75 may be in contact with a portion between the third conductive semiconductor layer 73 and the reflective layer 77. The contact layer may be formed of material selected from indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), ZnO, IrOx, RuOx, NiO, Al, Ag, Pd, Rh, Pt and Ir. The reflective layer 77 may be selectively formed of Al, Ag, Pd, Rh, Pt, or Ir. The contact layer 75 can be removed.

Such a light emitting device 101A may be provided in a flip chip structure. The substrate 21 can be removed from the light emitting device 101A.

Figure 4:
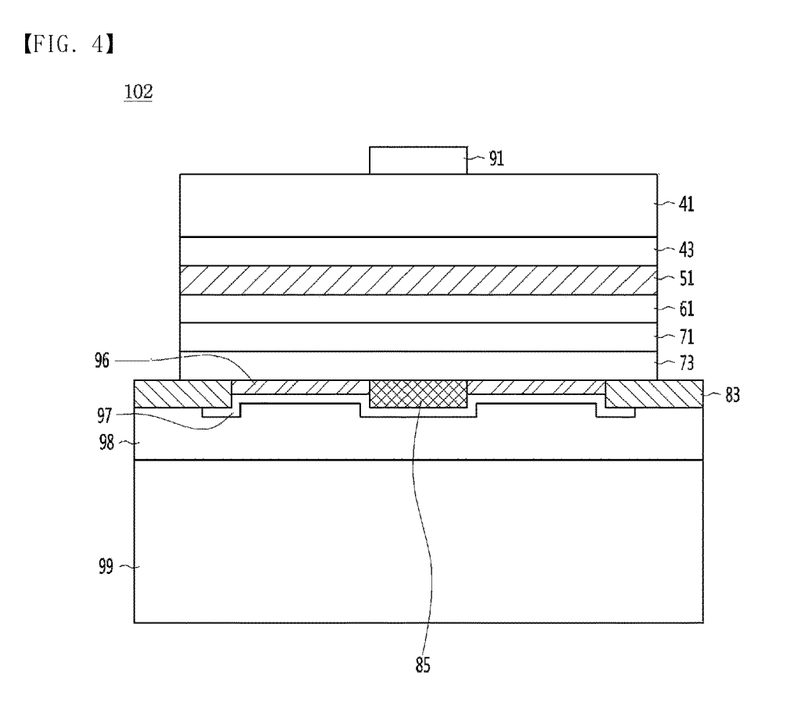
FIG. 4 is a view illustrating another example in which electrodes are disposed in the light emitting device of FIG. 1.

FIG. 4 illustrates another example in which electrodes are disposed in the light emitting element of FIG. 1. In description of FIG. 4, portions having the same configuration as those described above will refer to the description of the embodiments disclosed above.

With reference to FIG. 4, in the light emitting device 102, a first electrode 91 is disposed on the first conductive semiconductor layer 41, a first clad layer 43, an active layer 51, and an electron blocking layer 61 are disposed under the first conductive semiconductor layer 41, and a second electrode having a plurality of conductive layers 96, 97, 98, and 99 includes under the second and third conductive semiconductor layers 71 and 73.

The second electrode is disposed under the third conductive semiconductor layer 73 and includes a contact layer 96, a reflective layer 97, a bonding layer 98, and a support member 99. The contact layer 96 is in contact with the semiconductor layer, for example, the third conductive semiconductor layer 73. The contact layer 96 may be a low conductive material such as ITO, IZO, IZTO, IAZO, IGZO, IGTO, AZO, and ATO or may use a metal of Ni or Ag. A reflective layer 97 is disposed under the contact layer 96 and the reflective layer 97 is made of a structure including at least one layer which is formed of a material selected from a group including Ag, Ni, Al, Rh, Pd, Ir, Ru, Mg, Zn, Pt, Au, Hf, and the combination thereof. The reflective layer 97 may be in contact with the bottom surface of the third conductive semiconductor layer 73, but the present embodiment is not limited thereto. The contact layer 96 may be formed of a metal or a non-metal material among the materials described above. The contact layer 96 may be removed.

A bonding layer 98 is disposed under the reflective layer 97, the bonding layer 98 may be used as a barrier metal or a bonding metal, and the material thereof may include at least one of Ti, Au, Sn, Ni, Cr, Ga, In, Bi, Cu, Ag, and Ta and an optional alloy, for example.

A channel layer 83 and a current blocking layer 85 are disposed between the third conductive semiconductor layer 73 and the second electrode. The channel layer 83 may be formed of a non-metallic material and may be defined as a protective layer.

The channel layer 83 is formed along a lower surface edge of the third conductive semiconductor layer 73 and may be formed in a ring shape, a loop shape, or a frame shape. The channel layer 83 includes a transparent conductive material or an insulating material and may include at least one of ITO, IZO, IZTO, IAZO, IGZO, IGTO, AZO, ATO, $SiO_2$, $SiO_x$, $SiO_xN_y$, $Si_3N_4$, $Al_2O_3$, and $TiO_2$. The inner side portion of the channel layer 163 is disposed under the third conductive semiconductor layer 73 and the outer side portion thereof is disposed further outward than a side surface of the semiconductor structures 41, 43, 51, 61, 71, 73.

The current blocking layer 85 may be disposed between the third conductive semiconductor layer 73 and the contact layer 96 or the reflective layer 97. The current blocking layer 85 may include insulating material and may include at least one of $SiO_2$, $SiO_x$, $SiO_xN_y$, $Si_3N_4$, $Al_2O_3$, and $TiO_2$, for example. As another example, the current blocking layer 85 may be also formed of a metal for Schottky contact.

The current blocking layer 85 may be disposed at a position which corresponds to the first electrode 91 in the vertical direction. The current blocking layer 85 may block the current supplied from the second electrode and diffuse the current to another path. One or a plurality of current blocking layer(s) 85 may be disposed and at least a portion or the entire region of the current blocking layer 85 may overlap the first electrode 91 in the vertical direction. The width of the current blocking layer 85 in the horizontal direction may be more than the width of the first electrode 91 in the horizontal direction. The current blocking layer 85 having the width may diffuse a current which is transmitted to the first electrode 91.

A support member 99 is formed under the bonding layer 98 and the support member 99 may be formed of a conductive member. The material of the support member 99 may be formed of at least one of copper (Cu), gold (Au), nickel (Ni), molybdenum (Mo), copper-tungsten (Cu—W), and carrier wafers (for example, Si, Ge, GaAs, ZnO, SiC, or the like), for example. As another example, the support member 99 may be implemented as a conductive sheet.

Here, the substrate of FIG. 1 is removed. A growth substrate removal method may include by a physical method (for example, laser lift off) and/or a chemical method (wet etching, or the like) and can expose the first conductive semiconductor layer 41. The first electrode 91 is formed on the first conductive semiconductor layer 41 by performing the isolation etching in the direction in which the substrate is removed.

The upper surface of the first conductive semiconductor layer 41 may be formed with a light extraction structure (not illustrated) such as a roughness. Accordingly, The light emitting device 102 having a vertical electrode structure having the first electrode 91 over the semiconductor structure 41, 43, 51, 61, 71, and 73 and the support member 99 thereunder can be manufactured.

The light emitting device 102 according to the embodiment can emit light having ultraviolet wavelength, for example, a UV-C wavelength.

<Light Emitting Device Package>

Figure 5:
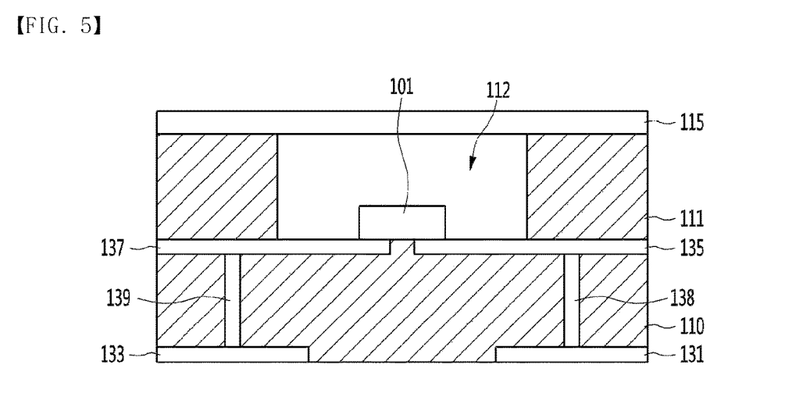
FIG. 5 is a cross-sectional view illustrating a light emitting device package having the light emitting device of FIG. 2.

FIG. 5 is a view illustrating a light emitting device package having the light emitting device of FIG. 2.

With reference to FIG. 5, the light emitting device package includes a support member 110, a reflective member 111 that is disposed on the support member 110 and has a cavity 112, a light emitting device 101 according to an embodiment, which is disposed on the support member 110 and in the cavity 112, and a transparent window 115 which is disposed within the cavity 112.

The support member 110 may be formed of at least one of a resin-based printed circuit board (PCB), a silicon-based material such as silicon or silicon carbide (SiC), a ceramic-based material such as aluminum nitride (AlN), a resin-based material such as polyphthalamide (PPA), liquid crystal polymer, PCB having a metal layer on the bottom (MCPCB: metal core PCB). However, the present embodiment is not limited to such a material.

The support member 110 includes a first metal layer 131, a second metal layer 133, a first connection member 138, a second connection member 139, a first electrode layer 135, and a second electrode layer 137. The first metal layer 131 and the second metal layer 132 are disposed to be spaced apart from each other on a bottom of the support member 110. The first electrode layer 135 and the second electrode layer 137 are disposed to be spaced apart from each other on an upper surface of the support member 110. The first connection member 138 may be disposed on an inner portion or a first side surface of the support member 110 and connects the first metal layer 131 and the first electrode layer 135 to each other. The second connection member 139 may be disposed on the inside portion or a second side surface of the support member 110 and connects the second metal layer 133 and the second electrode layer 137 to each other.

The first metal layer 131, the second metal layer 133, the first electrode layer 135 and the second electrode layer 137 may be formed of a metal material such as at least one of titanium (Ti), copper (Cu), nickel (Ni), gold (Au), chromium (Cr), tantalum (Ta), platinum (Pt), tin (Sn), silver (Ag) and phosphorus (P) or optional alloy thereof and may be formed of a single metal layer or a multilayer metal layer.

The first connection member 138 and the second connection member 139 include at least one of a via, a via hole, and a through hole.

The reflective member 111 may be disposed on the support member 110 around the cavity 112 to reflect ultraviolet light emitted from the light emitting device 101.

The reflection member 111 may be formed of at least one of a resin-based printed circuit board (PCB), a silicon-based material such as silicon or silicon carbide (SiC), a ceramic-based material such as aluminum nitride (AlN), a resin-based material such as polyphthalamide (PPA), or a liquid crystal polymer. However, the present embodiment is not limited to such a material. The support member 110 and the reflecting member 111 may include a ceramic-based material and the ceramic-based material is characterized in that heat radiation efficiency thereof is higher than that of the resin material.

The light emitting device 101 may be disposed on at least one or any one of the first and the second electrode layers 135 and 137 or may be disposed on the support member 110 and may be electrically connected to the first electrode layer 135 and the second electrode layer 137. As another example, the light emitting device 101 may be bonded to the first and the second electrode layers 135 and 137 in a flip chip manner. The light emitting device 101 may be disposed in a flip structure to extract light in the substrate direction or in the first conductive semiconductor layer direction.

The light emitting device package emits light having ultraviolet wavelength. The light emitting device may emit light having a wavelength of 290 nm or less, for example, a wavelength in a range of 200 nm to 290 nm. The light emitting device may be a device emitting light having UV-C wavelength.

The light emitting device 101 may emit light having ultraviolet length or emit light having a different wavelength when the phosphor layer is disposed on the light emitting device 101.

The transparent window 115 is disposed within the cavity 112 and emits light having a peak wavelength emitted from the light emitting device 101. The transparent window 115 may include a glass material, a ceramic material, or a translucent resin material.

In addition, an optical lens or a phosphor layer may be further disposed within the cavity 112, but the present embodiment is not limited thereto.

The light emitting device or the light emitting device package according to the embodiment can be applied to a light unit. The light unit is an assembly having one or a plurality of light emitting device(s) or a light emitting device package, and may include an ultraviolet lamp.

Figure 6:
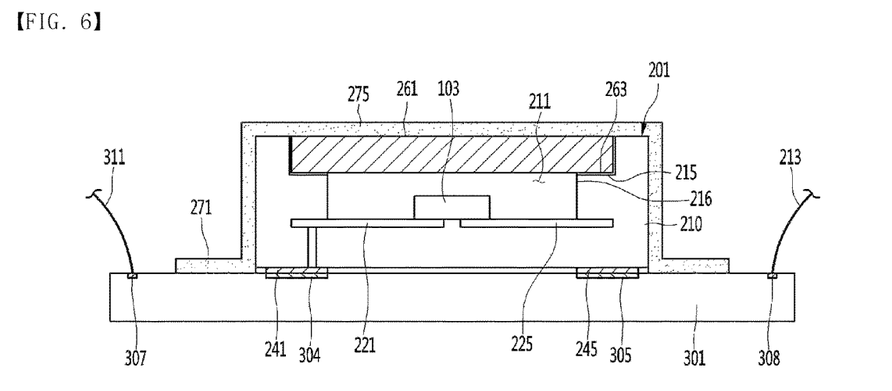
FIG. 6 is a view illustrating a light source module having a light emitting device according to an embodiment.

FIG. 6 is a view illustrating a light source module having a light emitting device or a light emitting device package according to the embodiment. The light source module according to the embodiment may be a light unit.

With reference to FIG. 6, the light source module according to the embodiment includes a light emitting device package 201 that has the light emitting device 103 disclosed in the embodiment, a circuit board 301 on which the light emitting device package 201 is disposed, and a moisture-proof film 275 that covers the light emitting device package 201 and the circuit board 301.

The light emitting device package 201 includes a body 210 which has a cavity 211, a plurality of electrodes 221 and 225 which are disposed in the cavity 211, a light emitting device 103 which is disposed on at least one of the plurality of electrodes 221 and 225, and a transparent window 261 which is disposed within the cavity 111.

The light emitting device 103 may include an optional peak wavelength within a range of ultraviolet wavelength to visible wavelength. The light emitting device 103 may emit light having, for example, a UV-C wavelength, that is ultraviolet wavelength in the range of 200 nm to 290 nm.

The body 210 includes an insulating material such as a ceramic material. The ceramic material includes a low temperature co-fired ceramic (LTCC) or a high temperature co-fired ceramic (HTCC) which is co-fired. The material of the body 210 may be, for example, AlN and may be formed of a metal nitride having a thermal conductivity of 140 W/mK or more.

The upper periphery of the body 210 includes a stepped structure 215. The stepped structure 215 is a region that is lower than the upper surface of the body 210 and is disposed on the upper periphery of the cavity 211. The depth of the stepped structure 215 is a depth from the upper surface of the body 210 and may be formed to be deeper than the thickness of the transparent window 261, but is not limited thereto.

The cavity 211 is a region where a portion of the upper region of the body 210 is opened and may be formed to have a predetermined depth from the upper surface of the body 210.

The cavities 211 and the electrodes 221 and 225 in the body 210 may be electrically connected to the electrode pads 241 and 245 disposed on the lower surface of the body 210. Material of the electrodes 221 and 225 and the electrode pads 241 and 245 may selectively include a metal such as platinum (Pt), titanium (Ti), copper (Cu), nickel (Ni), gold (Au), tantalum (Ta), and aluminum (Al).

The light emitting device 103 may be mounted on the electrodes 221 and 225 in the cavity 211 in a flip chip manner without a separate wire. The light emitting device 103 may be an ultraviolet light emitting diode according to the first and second embodiments, and may be an ultraviolet light emitting device having a wavelength ranging from 200 nm to 290 nm.

The transparent window 261 is disposed within the cavity 211. The transparent window 261 includes a glass material such as quartz glass. Accordingly, the transparent window 261 can be defined as a material that can be transmitted the light emitted from the light emitting device 103 without damages such as bond breakage between molecules due to the ultraviolet wavelength.

The outer periphery of the transparent window 261 is coupled to the stepped structure 215 of the body 210. An adhesive layer 263 is applied between the transparent window 261 and the stepped structure 215 of the body 210 and the adhesive layer 263 includes a resin material such as silicone or epoxy.

The transparent window 261 may be spaced apart from the light emitting device 103. Expansion of the transparent window 261 due to the heat generated by the light emitting device 103 can be prevented by the transparent window 261 being spaced apart from the light emitting device 103.

The circuit board 301 includes a plurality of bonding pads 304 and 305 and the plurality of bonding pads 304 and 305 may be electrically connected to the pads 241 and 245 disposed on the lower surface of the body 210.

The circuit board 301 may be connected to the signal cables 311 and 313 through external connection terminals 307 and 308 and the signal cables 311 and 313 supply power from the outside.

The moisture-proof film 275 is disposed on the upper surface and the side surface of the light emitting device package 201 and on the upper surface of the circuit board 301. The moisture-proof film 275 is disposed on the upper surface of the transparent window 261 and the upper surface and the side surface of the body 210 of the light emitting device package 201. An extended portion 271 of the moisture-proof film 275 extends from the side surface of the body 210 to the upper surface of the circuit board 301 and is disposed thereon. The moisture-proof film 275 may have a size that covers the upper surface and the side surface of the light emitting device package 201 and the upper surface of the circuit substrate 301 and may be in contact with the light emitting device package 201 and the circuit board 301.

The moisture-proof film 275 is a fluororesin-based material and can transmit the light without being broken by the light emitted from the light-emitting element 103. The moisture-proof film 275 may use at least one of polychlorotrifluoroethylene (PCTFE), ethylene+tetrafluoroethylene (ETFE), fluorinated ethylene propylene copolymer (FEP), and perfluoroalkoxy (PFA).

The moisture-proof film 275 may block water or moisture penetrating into the circuit board 301 as well as water or moisture penetrating through the side surface and the upper surface of the light emitting device package 201. The thickness of the moisture-proof film 275 may be formed in the range of 0.5 µm to 10 µm and when the thickness of the moisture-proof film 275 exceeds the above range, the light transmittance is markedly decreased, and when the thickness of the moisture-proof film 275 is less than the range described above, the humidity resistance is decreased.

The moisture-proof film 275 may be spaced apart from the bonding areas of the external connection terminals 307 and 308 and the signal cables 311 and 313. As another example, the moisture-proof film 275 may cover the external connection terminals 307 and 308. In this case, the moisture-proof film 275 can prevent penetration of water or moisture through the external connection terminals 307 and 308.

As illustrated above, the features, structures, effects and the like described in the embodiments are included in at least one embodiment and are not necessarily limited to only one embodiment. Further, the features, structures, effects, and the like illustrated in each embodiment can be implemented by being combined and modified with respect to the other embodiment by those of ordinary skill in the art to which the invention pertains. Accordingly, it is to be understood that the contents relating these combinations and modifications include within the scope of the present invention.

In addition, as illustrated described above, although the embodiments are mainly described, the embodiments are merely described as examples and do not limit the present invention and it will be understood that those of ordinary skill in the art to which the invention pertains can performs various modifications and applications which are not described as examples in the description described above without departing from essential characteristics of the present embodiment. For example, each component specifically illustrated in the embodiment can be modified and implemented. It is to be understood that the differences related the modifications and applications are contained in the scope of the present invention defined in claims attached.

INDUSTRIAL APPLICABILITY

The light emitting device according to the embodiments can provide a device for Ultraviolet-C (UV-C) wavelength.

The embodiments can improve the transmittance of the ultraviolet light emitting device.

The embodiments can improve the electrical characteristics of the ultraviolet light emitting device.

The invention claimed is:
1. A light emitting device comprising:
a first conductive semiconductor layer;
an active layer that is disposed on the first conductive semiconductor layer and generates ultraviolet wavelength;
an electron blocking layer that is disposed on the active layer;
a second conductive semiconductor layer that is disposed on the electron blocking layer;
a third conductive semiconductor layer that is disposed on the second conductive semiconductor layer; and
an electrode that is disposed on the third conductive semiconductor layer and electrically connected to the third conductive semiconductor layer,
wherein the second and third conductive semiconductor layers include an AlGaN semiconductor,
wherein the third conductive semiconductor layer has a lower aluminum composition than that of the second conductive semiconductor layer, and
wherein the third conductive semiconductor layer has an electrical contact resistance that is lower than that of the second conductive semiconductor layer.

2. The light emitting device according to claim 1, wherein difference in composition of aluminum between the third conductive semiconductor layer and the second conductive semiconductor layer is 10% or more.

3. The light emitting device according to claim 2, wherein the composition of aluminum of the second conductive semiconductor layer is 50% or more, and
wherein the composition of aluminum of the third conductive semiconductor layer is in a range of 20% to 40%.

4. The light emitting device according to claim 1, wherein the electrode includes metal material, and
wherein the third conductive semiconductor layer is in ohmic contact with the electrode.

5. The light emitting device according to claim 2, further comprising:
at least one of a contact layer which is disposed between the electrode and the third conductive semiconductor layer and a reflective layer which is disposed between the contact layer and the electrode.

6. The light emitting device according to claim 2, wherein the first conductive semiconductor layer includes at least one of an AlN semiconductor layer, a superlattice structure of an AlN/AlGaN, and an AlGaN semiconductor layer.

7. The light emitting device according to claim 4, further comprising:
an AlN substrate provided under the first conductive semiconductor layer.

8. The light emitting device according to claim 1, wherein the active layer generates wavelength in a range of 200 nm to 290 nm.

9. The light emitting device according to claim 3, wherein the third conductive semiconductor layer has a thickness of 500 nm or less.

10. The light emitting device according to claim 2, wherein the second and the third conductive semiconductor layers include a P-type dopant.

11. The light emitting device according to claim 10, wherein a concentration of the P-type dopant of the third conductive semiconductor layer is higher than that of the P-type dopant of the second conductive semiconductor layer.

12. The light emitting device according to claim 11, wherein the active layer includes a plurality of well layers and a plurality of barrier layers, and
wherein the well layer and the barrier layer include an AlGaN-based semiconductor.

13. The light emitting device according to claim 2, wherein the first conductive semiconductor structure has an AlGaN/GaN superlattice structure, and
wherein difference in composition of aluminum in the AlGaN/GaN superlattice structure is gradually increased, as the first conductive semiconductor structure is positioned to be adjacent to the active layer.

14. A light unit comprising:
a body that has a cavity;

a light emitting device disposed within the cavity, the light emitting device is a device of claim 1;

a transparent window that is disposed within the cavity; and a moisture-proof film that is disposed on the transparent window and the body.

15. A light emitting device comprising:

an AlN substrate;

a first conductive semiconductor layer that is disposed on the AlN substrate and that has composition of aluminum;

an active layer that is disposed on the first conductive semiconductor layer and that generates ultraviolet wavelength;

a second conductive semiconductor layer that is disposed on the active layer;

a third conductive semiconductor layer which is disposed on the second conductive semiconductor layer; and an electrode that is in contact with an upper surface of the third conductive semiconductor layer and that is formed of metal, wherein the second and the third conductive semiconductor layers include an AlGaN-based semiconductor, wherein the third conductive semiconductor layer has composition of aluminum which is lower than that of the second conductive semiconductor layer, wherein the third conductive semiconductor layer has an electrical contact resistance that is lower than that of the second conductive semiconductor layer, wherein the third conductive semiconductor layer is in ohmic contact with the electrode, wherein the electrode includes metal material, wherein difference in composition of aluminum between the third conductive semiconductor layer and the second conductive semiconductor layer is 10% or more, wherein the first conductive semiconductor structure has an AlGaN/GaN superlattice structure, and wherein difference in composition of aluminum in the AlGaN/GaN superlattice structure is gradually increased, as the first conductive semiconductor structure is positioned to be adjacent to the active layer.

16. The light emitting device according to claim 15, wherein the second and the third conductive semiconductor layers include a P-type dopant, wherein the composition of aluminum of the second conductive semiconductor layer is 50% or more, wherein the composition of aluminum of the third conductive semiconductor layer is in a range of 20% to 40%, and wherein a concentration of the P-type dopant of the third conductive semiconductor layer is higher than that of the P-type dopant of the second conductive semiconductor layer.

17. The light emitting device according to claim 15, wherein the third conductive semiconductor layer has a thickness of 500 nm or less.

18. The light emitting device according to claim 15, wherein the active layer generates a wavelength in a range of 200 nm to 290 nm, wherein the active layer includes a plurality of well layers and a plurality of barrier layers, and wherein the well layer and the barrier layer include an AlGaN-based semiconductor.

19. A light unit comprising:

a body that has a cavity;

a light emitting device disposed within the cavity, the light emitting device is a device of claim 15;

a transparent window that is disposed within the cavity; and a moisture-proof film that is disposed on the transparent window and the body.

\* \* \* \* \*